(12) United States Patent
Ryzhikov et al.

(10) Patent No.: US 7,630,136 B2
(45) Date of Patent: Dec. 8, 2009

(54) OPTICAL INTEGRATORS FOR LITHOGRAPHY SYSTEMS AND METHODS

(75) Inventors: Lev Ryzhikov, Norwalk, CT (US); Abel Joobeur, Milford, CT (US); Yevgeniy Konstantinovich Shmarev, Lagrangeville, NY (US)

(73) Assignee: ASML Holding N.V., Veldhoven (NL)

( * ) Notice: Subject to any disclaimer, the term of this patent is extended or adjusted under 35 U.S.C. 154(b) by 366 days.

(21) Appl. No.: 11/488,174

(22) Filed: Jul. 18, 2006

(65) Prior Publication Data
US 2008/0019008 A1    Jan. 24, 2008

(51) Int. Cl.
G02B 27/14    (2006.01)
(52) U.S. Cl. .................................. 359/629; 359/627
(58) Field of Classification Search ............. 359/629
See application file for complete search history.

(56) References Cited

U.S. PATENT DOCUMENTS

| | | | |
|---|---|---|---|
| 3,535,507 A | 10/1970 | Sugino | |
| 4,497,015 A | 1/1985 | Konno et al. | |
| 4,656,562 A | 4/1987 | Sugino | |
| 4,918,583 A | 4/1990 | Kudo et al. | |
| 5,229,872 A | 7/1993 | Mumola | |
| 5,296,891 A | 3/1994 | Vogt et al. | |
| 5,303,001 A | 4/1994 | Jeong et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,748,376 A * | 5/1998 | Lin et al. | 359/629 |
| 5,808,797 A | 9/1998 | Bloom et al. | |
| 5,982,553 A | 11/1999 | Bloom et al. | |
| 6,128,133 A | 10/2000 | Bergmann | |
| 6,133,986 A | 10/2000 | Johnson | |
| 6,177,980 B1 | 1/2001 | Johnson | |
| 6,205,271 B1 | 3/2001 | Bowron et al. | |
| 6,687,041 B1 | 2/2004 | Sandstrom | |
| 6,733,165 B2 | 5/2004 | Van Der Lei et al. | |
| 6,747,783 B1 | 6/2004 | Sandstrom | |

(Continued)

FOREIGN PATENT DOCUMENTS

WO    WO 98/33096 A1    7/1998

(Continued)

*Primary Examiner*—Jordan M. Schwartz
*Assistant Examiner*—James C Jones
(74) *Attorney, Agent, or Firm*—Sterne, Kessler, Goldstein & Fox P.L.L.C.

(57) ABSTRACT

An optical integrator having a first surface and a second surface that is used in a lithographic apparatus to modify light. The first surface is reflective, defines a volume, and is configured to be disposed in an optical illumination system along an optical axis, to surround the optical axis, and to reflect a light along a path incident upon the first surface. The second surface is disposed in the volume and has a first section of the second surface that is semi-reflective and is configured to reflect a first portion of a light along a path incident upon the first section of the second surface and to transmit a second portion of the light along the path incident upon the first section of the second surface. The second surface increases the number of reflections of the light to increase the uniformity of the intensity distribution of the light.

24 Claims, 10 Drawing Sheets

U.S. PATENT DOCUMENTS

| | | |
|---|---|---|
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,819,493 B2 | 11/2004 | Mizouchi |
| 2004/0041104 A1 | 3/2004 | Liebregts et al. |
| 2004/0130561 A1 | 7/2004 | Jain |
| 2005/0007572 A1 | 1/2005 | George et al. |

FOREIGN PATENT DOCUMENTS

| | | |
|---|---|---|
| WO | WO 98/38597 A2 | 9/1998 |
| WO | WO 98/38597 A3 | 9/1998 |

\* cited by examiner

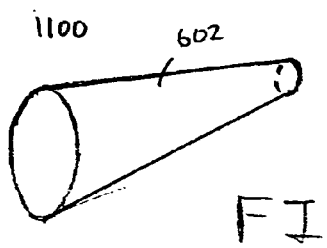
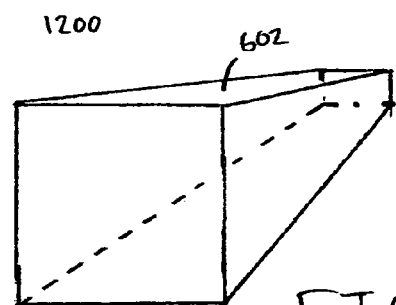
FIG. 11
FIG. 12
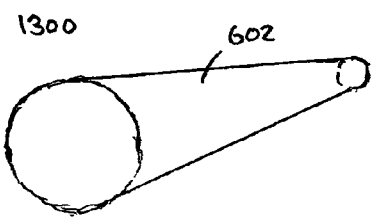
FIG. 13
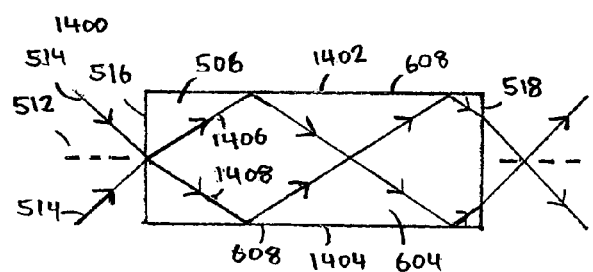
FIG. 14
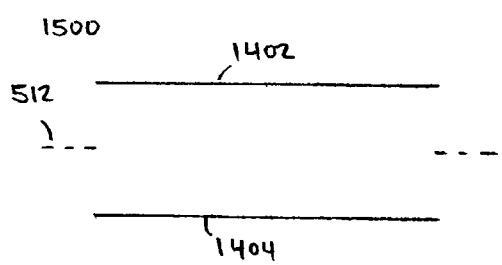
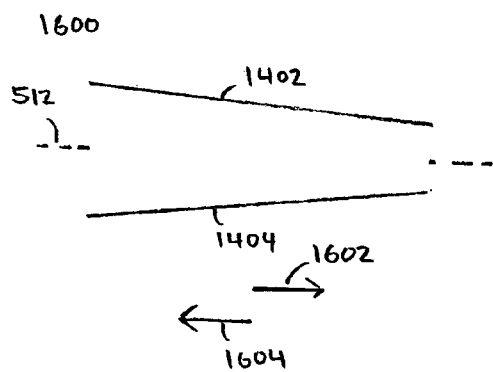
FIG. 15
FIG. 16

2500

Reflect a Light Along a Path Incident Upon — 2502
a First Surface From the First Surface

↓

Reflect a First Portion of a Light Along a Path Incident Upon — 2504
a First Section of a Second Surface From the First Section of the Second Surface

↓

Transmit a Second Portion of the Light Along the Path Incident Upon — 2506
the First Section of the Second Surface From the First Section of the Second Surface

Reflect a Light Along a Path Incident Upon — 2602
a First Surface From the First Surface

↓

Reflect a First Portion of a Light Along a Path Incident Upon — 2604
a First Section of a Second Surface From the First Section of the Second Surface

Reflect a Light Along a Path Incident Upon — 2702
a First Surface From the First Surface

↓

Reflect a Light Along a Path Incident Upon — 2704
a Second Surface From the Second Surface

↓

Reflect a First Portion of a Light Along a Path Incident Upon — 2706
a First Section of a Third Surface From the First Section of the Third Surface

FIG. 27

OPTICAL INTEGRATORS FOR LITHOGRAPHY SYSTEMS AND METHODS

BACKGROUND OF THE INVENTION

1. Field of the Invention

The present invention relates to optical integrators.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

A lithographic apparatus includes an optical illumination system. It is frequently desirable in an optical illumination system to produce a substantially telecentric beam in which the intensity of the light, across a plane orthogonal to the optical axis (the axis that defines the direction of propagation of the beam), has a substantially uniform distribution. Unfortunately, because the illumination source usually produces a beam in which this intensity has a Gaussian distribution and/or a beam having a relatively low degree of telecentricity, an optical device is often disposed in the optical illumination system to modify the beam to compensate for this situation. In many optical illumination systems, this optical device is an optical integrator.

An optical integrator is an object having: (1) a surface is configured to surround the optical axis, or (2) two separate surfaces with the optical axis between them. A volume within the optical integrator can be an object made of a material that is transparent to a wavelength of light produced by the illumination source, a gas, or a vacuum. The optical illumination system is configured to cause the beam to enter the optical integrator so that the light reflects from the surface or surfaces so that the beam that exits the optical integrator has a more uniform intensity distribution and/or is more telecentric.

It is generally understood that the uniformity of the intensity distribution of a beam and the telecentricity of the beam increase with the number of reflections that the light experiences in an optical integrator. Typically, the number of reflections can be increased by: (1) increasing the length of the optical integrator along the optical axis, or (2) reducing the area of the optical integrator in the plane orthogonal to the optical axis and defined by the surface or surfaces of the optical integrator.

Increasing the length of the optical integrator entails an increase in the length of the optical illumination system, which increases the degree to which energy in the beam is absorbed. Reducing the area of the optical integrator in the plane orthogonal to the optical axis and defined by the surface or surfaces of the optical integrator entails an increase in the magnification power of the relay lens that is usually disposed at the exit of the optical integrator. Both approaches increase the cost and complexity of the optical illumination system. What is needed is a relatively short optical integrator with a surface or surfaces configured to define a relatively large area in the plane orthogonal to the optical axis, wherein the optical integrator is configured to cause a relatively high number of reflections from this surface or surfaces.

BRIEF SUMMARY OF THE INVENTION

The present invention relates to optical integrators. An embodiment of the optical integrator comprises a first surface and a second surface. The first surface is reflective, defines a volume, and is configured to be disposed in an optical illumination system along an optical axis, to surround the optical axis, and to reflect a light incident upon the first surface. The second surface is disposed in the volume and has a first section of the second surface that is semi-reflective. The first section of the second surface is configured to reflect a first portion of a light along a path incident upon the first section of the second surface and to transmit a second portion of the light along the path incident upon the first section of the second surface. For a given length along the optical axis and a given area in the plane orthogonal to the optical axis and defined by the first surface, the presence of the second surface within the first surface increases the number of reflections of the light.

Another embodiment of the optical integrator comprises a first surface and a second surface. The first surface is reflective, defines a volume, and is configured to be disposed in an optical illumination system along an optical axis, to surround the optical axis, and to reflect a light incident upon the first surface. The second surface is disposed in the volume and has a first section of the second surface that is at least semi-reflective. The first section of the second surface is configured to reflect a first portion of a light along a path incident upon the first section of the second surface. The volume is configured to comprise a gas or a vacuum.

Yet another embodiment of the optical integrator comprises a first surface, a second surface, and a third surface. The first and the second surfaces are reflective, define a volume, and are configured to be disposed in an optical illumination system along an optical axis with the optical axis between the first and the second surfaces. The first and the second surfaces are configured to reflect a light along a path incident upon the first surface and to reflect a light along a path incident upon the second surface. The second surface is separate from the first surface. The third surface is disposed in the volume and has a first section of the third surface that is at least semi-reflective. The first section of the third surface is configured to reflect a first portion of a light incident upon a first section of the third surface.

The present invention also relates to methods for increasing at least one of a uniformity of an intensity distribution of a beam of light and a telecentricity of the beam. In an embodiment of the method, a light along a path incident upon a first surface is reflected. A first portion of a light along a path incident upon a first section of a second surface is reflected. A second portion of the light along the path incident upon the first section of the second surface is transmitted. The first surface defines a volume. The second surface is disposed in the volume.

In another embodiment of the method, a light along a path incident upon a first surface is reflected. A first portion of a light along a path incident upon a first section of a second surface is reflected. The first surface defines a volume. The second surface is disposed in the volume. The volume is configured to comprise a gas or a vacuum.

In yet another embodiment of the method, a light along a path incident upon a first surface is reflected. A light along a path incident upon a second surface is reflected. A first portion of a light along a path incident upon a first section of a third surface is reflected. The first and the second surfaces define a volume. The third surface is disposed in the volume. The second surface is separate from the first surface.

Further embodiments, features, and advantages of the present inventions, as well as the structure and operation of the various embodiments of the present invention, are described in detail below with reference to the accompanying drawings.

BRIEF DESCRIPTION OF THE FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 7 through 13 depict embodiments 700 through 1300, respectively, of first surface 602.

FIG. 14 is a block diagram of an embodiment 1400 of optical integrator 506.

FIGS. 15 and 16 depict embodiments 1500 and 1600, respectively, of the orientation of second surface 1404 with respect to first surface 1402.

FIGS. 25 through 27 are flow charts of methods 2500 through 2700, respectively, for increasing at least one of a uniformity of an intensity distribution of a beam of light and a telecentricity of the beam according to the present invention.

Figure 1:
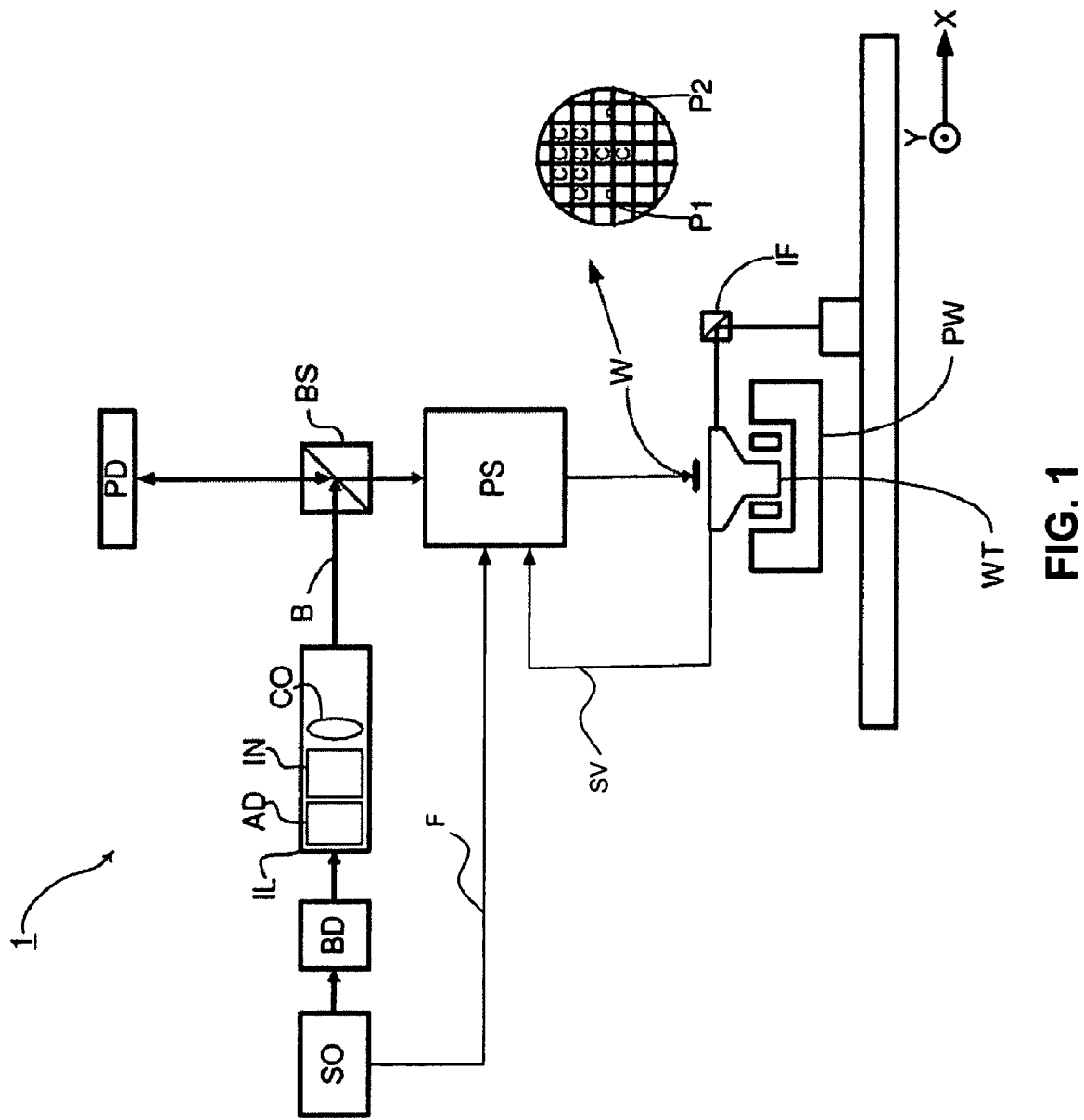
FIGS. 1 and 2 depict lithographic apparatus, according to various embodiments of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION OF THE INVENTION

The present invention relates to optical integrators. This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer may be: a III/V compound semiconductor wafer, a silicon wafer, a ceramic substrate, a glass substrate, or a plastic substrate. The substrate may be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 5001 µm, or at least 600 µm. Alternatively, the thickness of the substrate may be at most 5000 cm, at most 3500 µm, at most 2500 cm, at most 1750 µm, at most 1250 µm, at most 1000 µm, at most 800 µm, at most 600 µm, at most 5001 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA may be movable (e.g., with the use of one or more actuators) at least in the direction to and away from the substrate. Being able to move the MLA to and away from the substrate allows, e.g., for focus adjustment without having to move the substrate.

Figure 2:
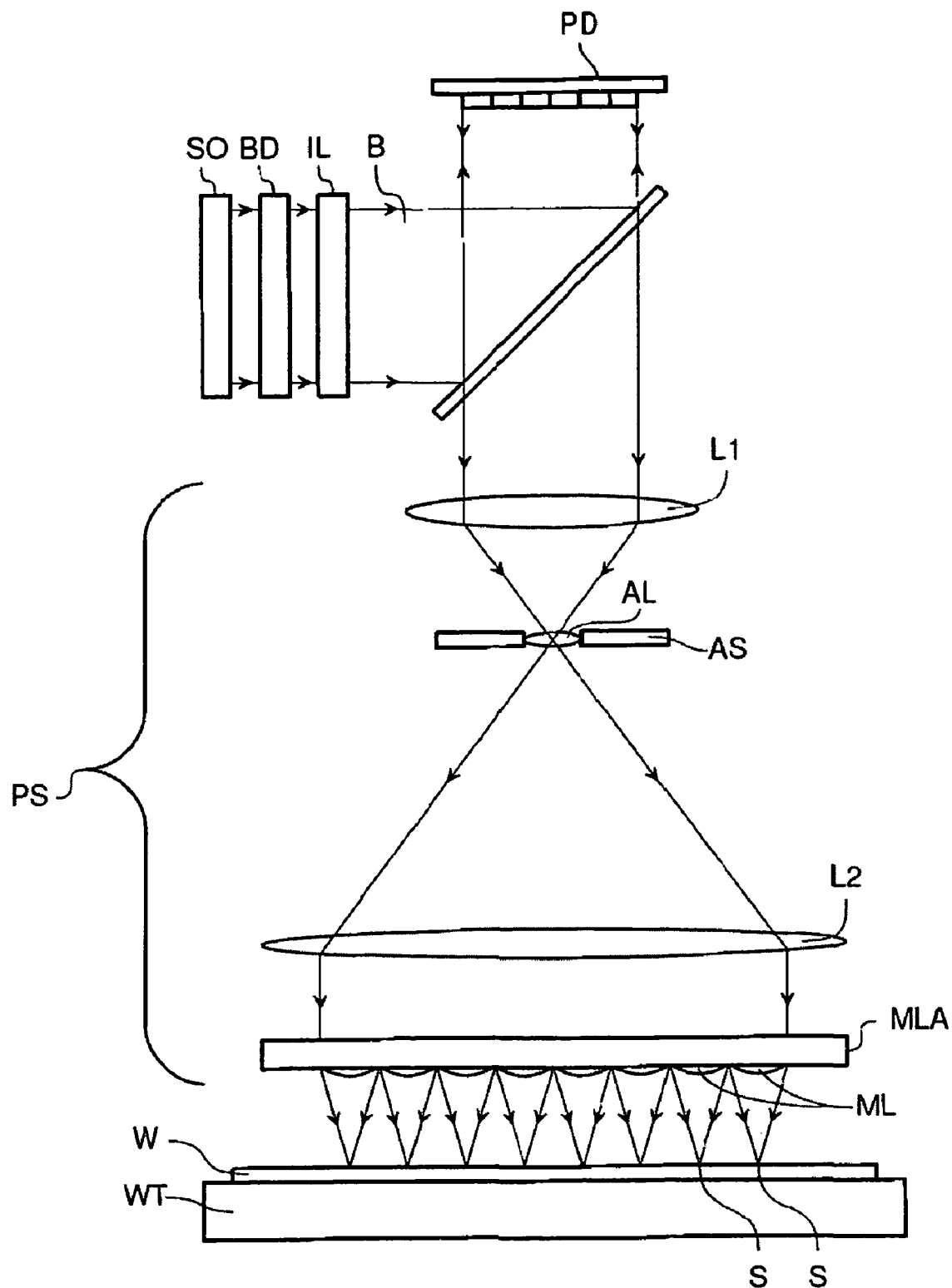

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation may have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
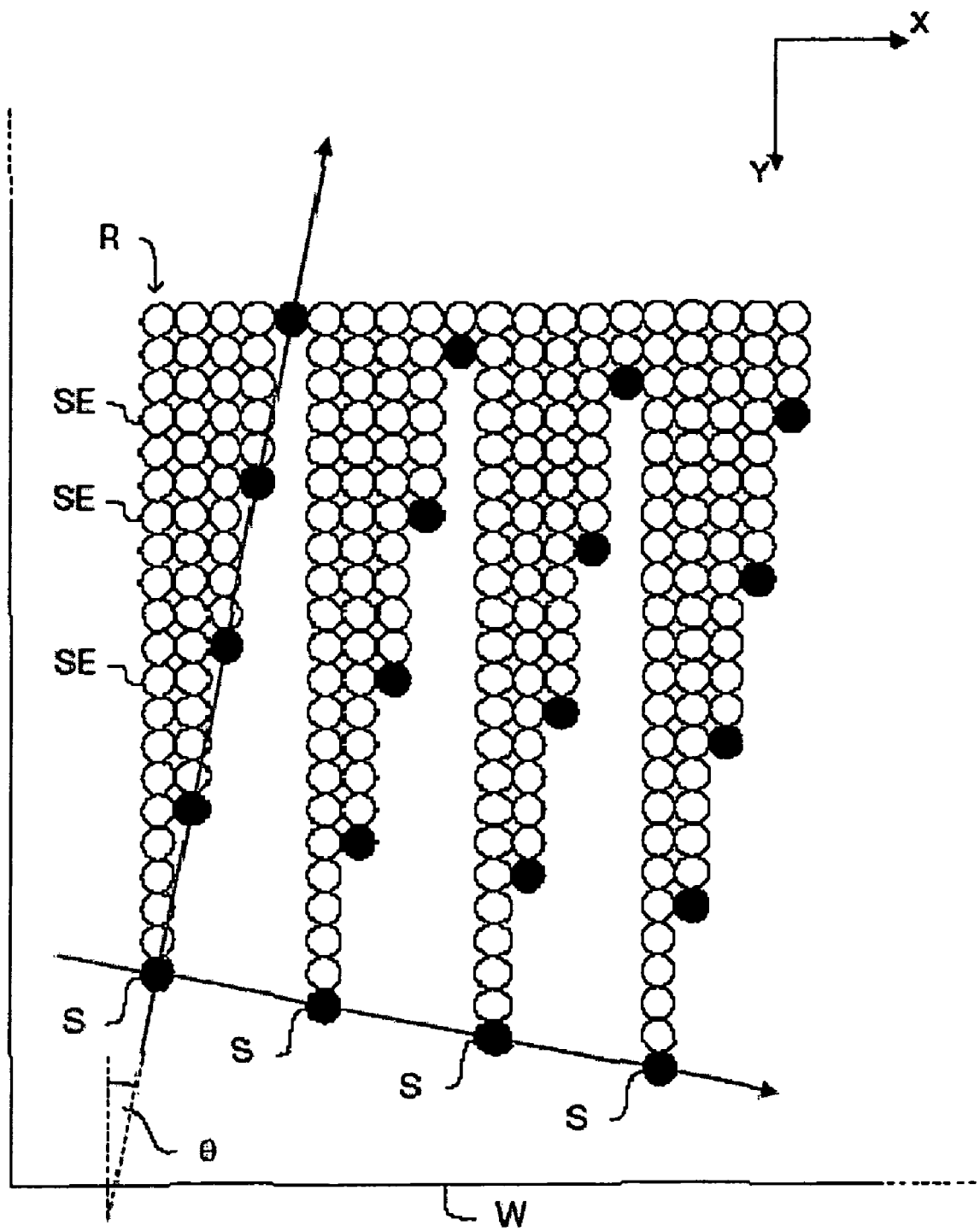
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle $\theta$ can be at most 20°, at most 10°, at most 5°, at most 3°, at most 1°, at most 0.5°, at most 0.25°, at most 0.10°, at most 0.05°, or at most 0.01°. Alternatively, the angle $\theta$ is at least 0.001°.

Figure 4:
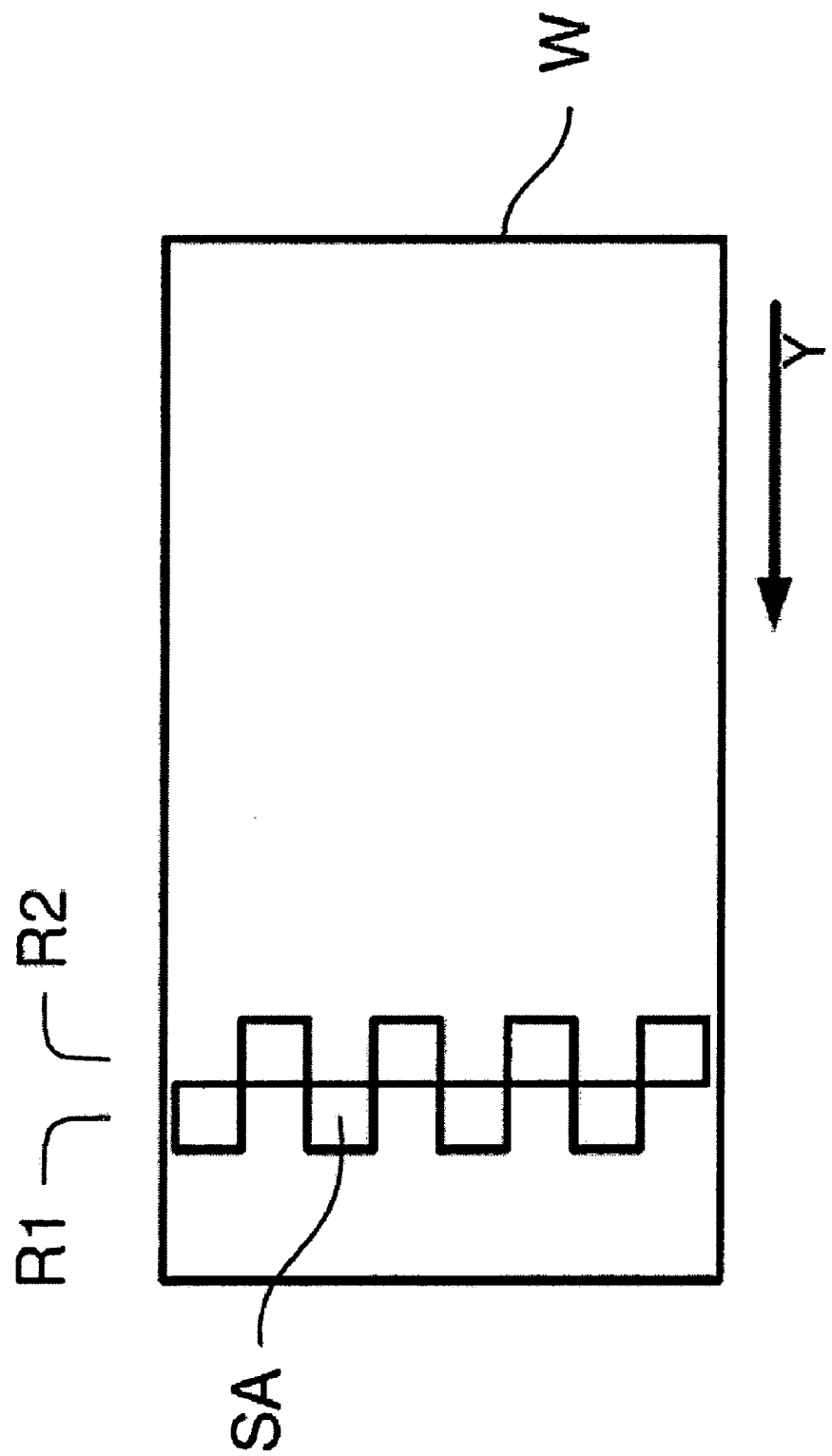
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
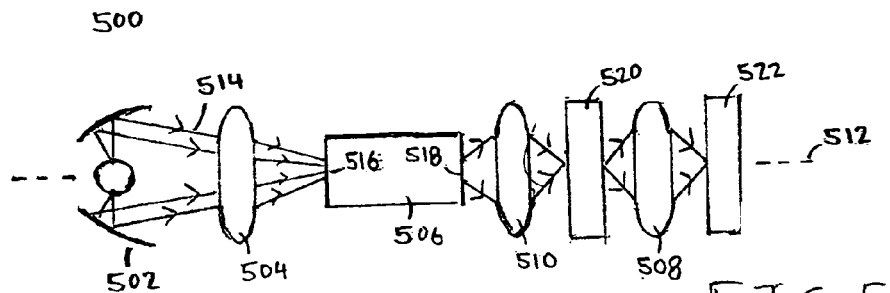
FIG. 5 is a block diagram of an exemplary optical illumination system 500 in which the present invention can be disposed.

FIG. 5 is a block diagram of an exemplary optical illumination system 500 in which the present invention can be disposed. However, the present invention is not limited to being disposed in optical illumination system 500. For example, the present invention can be disposed in the optical illumination systems used in the lithographic apparatuses depicted at FIGS. 1 and 2. Optical illumination system 500 comprises an illumination source 502, a condenser lens 504, an optical integrator 506, and a projection optics lens 508. Optionally, optical illumination system 500 can further comprise a relay lens 510. In optical illumination system 500, these elements are disposed along an optical axis 512.

Illumination source 502 is configured to produce a beam 514 of light. Usually, the intensity of the light in beam 514 across a plane orthogonal to optical axis 512 has a Gaussian distribution, beam 514 has a low degree of telecentricity, or both. Condenser lens 504 is configured to receive beam 514 and to converge beam 514 at an entrance 516 of optical integrator 506.

Optical integrator 506 is configured to receive beam 514 at entrance 516, to modify beam 514 to compensate for the nonuniform intensity distribution, the low degree of telecentricity, or both, and to produce modified beam 514 at an exit 518 of optical integrator 506. Optical illumination system 500 is configured to cause beam 514 to enter optical integrator 506 so that the light reflects from the surface or surfaces so that modified beam 514 that exits optical integrator 506 has a more uniform intensity distribution, is more telecentric, or both.

Relay lens 510, if disposed in optical illumination system 500, is configured to receive beam 514 at exit 518 and to image beam 514 onto a reticle 520. Projection optics lens 508 is configured to receive beam 514 from reticle 520 and to image beam 514 onto a wafer 522.

Figure 6:
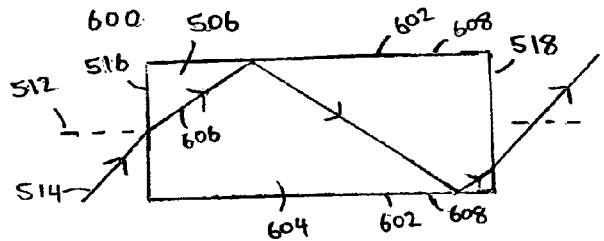
FIG. 6 is a block diagram of an embodiment 600 of optical integrator 506.

FIG. 6 is a block diagram of an embodiment 600 of optical integrator 506. Embodiment 600 comprises a first surface 602. First surface 602 is reflective, defines a volume 604, and is configured to be disposed in, for example, optical illumination system 500 (not shown), to surround optical axis 512, and to reflect the light along a path 606 incident upon first surface 602.

Figure 7:
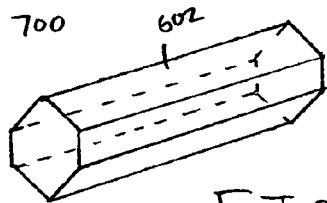
Figure 8:
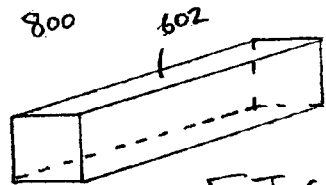
Figure 9:
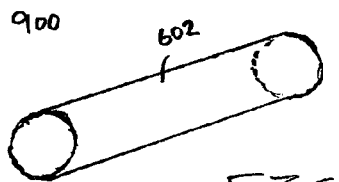
Figure 10:
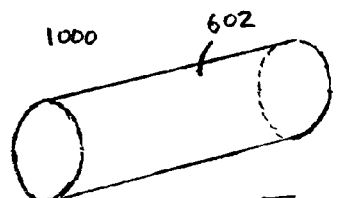

First surface 602 can have any of a number of shapes, which can be determined from the measure of the intensity distribution of the light across the plane orthogonal to optical axis 512 in beam 514 produced by illumination source 502, the degree of the telecentricity of beam 514 produced by illumination source 502, or both. For example, FIG. 7 depicts an embodiment 700 of first surface 602 having a shape that resembles a prism. FIG. 8 depicts an embodiment 800 of first surface 602 in which the prism is a rectangular prism. FIG. 9 depicts an embodiment 900 of first surface 602 having a shape that resembles a cylinder. FIG. 10 depicts an embodiment 1000 of first surface 602 in which the cylinder is an elliptic cylinder. FIG. 11 depicts an embodiment 1100 of first surface 602 having a shape that resembles a frustum. FIG. 12 depicts an embodiment 1200 of first surface 602 in which the frustum is a pyramidic frustum. FIG. 13 depicts an embodiment 1300 of first surface 602 in which the frustum is a conic frustum.

Returning to FIG. 6, first surface 602 can have a film 608 of a material that causes substantially optimal reflection of the light along path 606 at first surface 602 with substantially minimal transmission of the light along path 606 through first surface 602. Volume 604 can be an object (not shown) made of a material that is transparent to a wavelength of light produced by illumination source 502 (not shown). Alternatively, volume 604 can be configured to comprise a gas or a vacuum. The light along path 606 is depicted at FIG. 6 as experiencing, for example, a number of reflections (N) in embodiment 600 equal to two.

FIG. 14 is a block diagram of an embodiment 1400 of optical integrator 506. Embodiment 1400 comprises a first surface 1402 and a second surface 1404. First and second surfaces 1402 and 1404 are reflective and define volume 604. First and second surfaces 1402 and 1404 are configured to be disposed in, for example, optical illumination system 500 (not shown) along optical axis 512 with optical axis 512 between first and second surfaces 1402 and 1404. First surface 1402 is configured to reflect the light along a path 1406 incident upon first surface 1402. Second surface 1404 is configured to reflect the light along a path 1408 incident upon second surface 1404. Second surface 1404 is separate from first surface 1402.

The orientation of second surface 1404 with respect to first surface 1402 can be any of a variety of orientations, which can be determined from the measure of the intensity distribution of the light across the plane orthogonal to optical axis 512 in beam 514 produced by illumination source 502, the degree of the telecentricity of beam 514 produced by illumination source 502, or both. For example, FIG. 15 depicts an embodiment 1500 in which second surface 1404 is substantially parallel to first surface 1402. FIG. 16 depicts an embodiment 1600 in which, when beam 514 (not shown) of light is in a first direction 1602 along optical axis 512, second surface 1404 converges with first surface 1402. Alternatively, when beam 514 (not shown) of light is in a second direction 1604 along optical axis 512, second surface 1404 diverges with first surface 1402.

Returning to FIG. 14, each of first and second surfaces 1402 and 1404 can have film 608 of the material that causes substantially optimal reflection of the light along paths 1406 and 1408 at first and second surfaces 1402 and 1404 with substantially minimal transmission of the light along paths 1406 and 1408 through first and second surfaces 1402 and 1404. Volume 604 can be an object (not shown) made of the material that is transparent to the wavelength of light produced by illumination source 502 (not shown). Alternatively, volume 604 can be configured to comprise a gas or a vacuum. The light along each of paths 1406 and 1408 is depicted at FIG. 14 as experiencing, for example, a number of reflections (N) in embodiment 1400 equal to two.

In embodiments 600 or 1400, if volume 604 is an object made of the material that is transparent to the wavelength of light produced by illumination source 502, then this material can be, but is not limited to: glass, silica, or calcium fluoride. Optionally, entrance 516, exit 518, or both can have a film (not shown) of a material that causes substantially optimal transmission of beam 514 through the material that is transparent to the wavelength of light produced by illumination source 502.

It is generally understood that the uniformity of the intensity distribution of beam 514 and the telecentricity of beam 514 increase with the number of reflections that the light experiences in optical integrator 506. As may be surmised from embodiments 600 and 1400, the number of reflections can be increased by: (1) increasing the length of optical integrator 506 along optical axis 512, or (2) reducing the area of optical integrator 506 in the plane orthogonal to optical axis 512 and defined by first surface 602 or first and second surfaces 1402 and 1404. The number of reflections can also be increased by increasing a numerical aperture of beam 514 at entrance 516.

Figure 17:
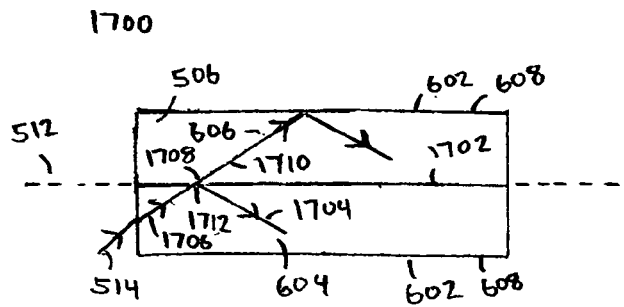
FIGS. 17 through 24 are block diagrams of embodiments 1700 through 2400, respectively, of optical integrator 506 according to the present invention.

FIG. 17 is a block diagram of an embodiment 1700 of optical integrator 506 according to the present invention. Embodiment 1700 comprises first surface 602 and a second surface 1702. First surface 602 is reflective, defines volume 604, and is configured to be disposed in, for example, optical illumination system 500 (not shown) along optical axis 512, to surround optical axis 512, and to reflect the light along path 606 incident upon first surface 602. First surface 602 can have film 608 of the material that causes substantially optimal reflection of the light along path 606 at first surface 602 with substantially minimal transmission of the light along path 606 through first surface 602. Volume 604 can be an object (not shown) made of the material that is transparent to the wavelength of light produced by illumination source 502 (not shown). Alternatively, volume 604 can be configured to comprise a gas or a vacuum.

Second surface 1702 is disposed in volume 604 and has a first section 1708 of second surface 1702 that is semi-reflective. First section 1708 of second surface 1702 is configured to reflect a first portion 1704 of the light along a path 1706 incident upon first section 1708 of second surface 1702 and to transmit a second portion 1710 of the light along path 1706 incident upon first section 1708 of second surface 1702. Second surface 1702 can be configured to increase at least one of a uniformity of an intensity distribution of beam 514 and a telecentricity of beam 514. The location of second surface 1702 in volume 604 can be determined from a measure of the intensity distribution of the light across the plane orthogonal to optical axis 512 in beam 514 (not shown) produced by illumination source 502 (not shown), the degree of the telecentricity of beam 514 (not shown) produced by illumination source 502 (not shown), or both. Likewise, the ratio of the intensity of first portion 1704 to the intensity of second portion 1710 can be determined from the measure of the intensity distribution of the light across the plane orthogonal to optical axis 512 in beam 514 (not shown) produced by illumination source 502 (not shown), the degree of the telecentricity of beam 514 (not shown) produced by illumination source 502 (not shown), or both.

First section 1708 of second surface 1702 can be substantially all of second surface 1702. Second surface 1702 can have a film 1712 of a material that causes reflection of first portion 1704 of the light along path 1706 incident upon second surface 1702 and transmission of second portion 1710 of the light along path 1706 incident upon second surface 1702. This material can be, but is not limited to: Ge, $MgF_2$, $SiO_2$, $TiO_2$, $ThF_4$, ZnS, ZnSe, or any combination of these. Furthermore, film 1712 can comprise multiple layers this material.

For a given length of optical integrator 506 along optical axis 512 and a given area of optical integrator 506 in the plane orthogonal to optical axis 512 and defined by first surface 602, the presence of second surface 1602 in volume 604 increases the number of reflections of the light within embodiment 1700. Generally, the total number of reflections (T) is proportional to the factorial of the product of the number of reflections (N) that would occur within first surface 602 without the presence of second surface 1702, multiplied by the sum of one added to the number of second surfaces 1702 within first surface 602 (M), as represented by the following relationship:

$$T \propto [N \times (1+M)]!$$

Thus, for a given total number of reflections (T), embodiment 1700 is a relatively short optical integrator 506 with first surface 602 configured to define a relatively large area in the plane orthogonal to optical axis 512.

Figure 18:
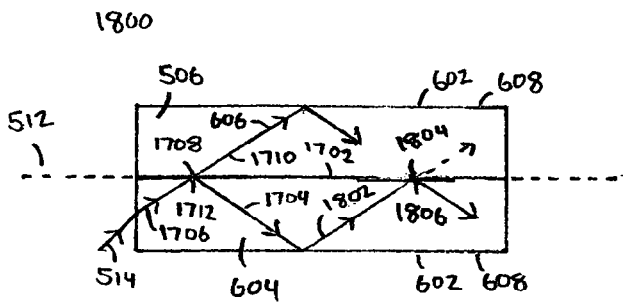

FIG. 18 is a block diagram of an embodiment 1800 of optical integrator 506 according to the present invention. Embodiment 1800 incorporates embodiment 1700. However, in embodiment 1800, second surface 1702 has a second section 1804 of second surface 1702 that is reflective. Second section 1804 of second surface 1702 is configured to reflect the light along a path 1802 incident upon second section 1804 of second surface 1702. First section 1708 of second surface 1702 can have film 1712 of the material that causes reflection of first portion 1704 of the light along path 1706 incident upon first section 1708 of second surface 1702 and transmission of second portion 1710 of the light along path 1706 incident upon first section 1708 of second surface 1702. Second section 1804 of second surface 1702 can have a film 1806 of a material that causes reflection of the light along path 1802 incident upon second section 1804 of second surface 1702.

Alternatively, second surface 1702 has second section 1804 of second surface 1702 that is transmissive. Second section 1804 of second surface 1702 is configured to transmit the light along path 1802 incident upon second section 1804 of second surface 1702. Again, first section 1708 of second surface 1702 can have film 1712 of the material that causes reflection of first portion 1704 of the light along path 1706 incident upon first section 1708 of second surface 1702 and transmission of second portion 1710 of the light along path 1706 incident upon first section 1708 of second surface 1702. However, second section 1804 of second surface 1702 can have a film (not shown) of a material that causes transmission of the light along path 1802 incident upon second section 1804 of second surface 1702.

The locations of first and second sections 1708 and 1804 of second surface 1702 can be determined from the measure of the intensity distribution of the light across the plane orthogonal to optical axis 512 in beam 514 (not shown) produced by illumination source 502 (not shown), the degree of the telecentricity of beam 514 (not shown) produced by illumination source 502 (not shown), or both.

Figure 19:
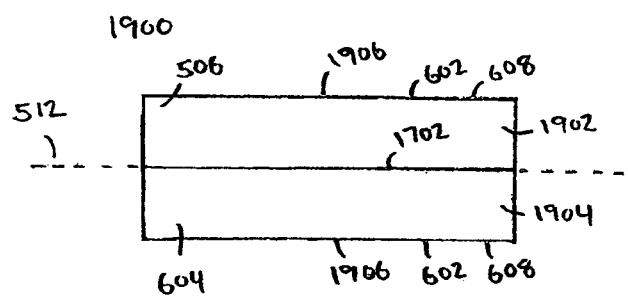

FIG. 19 is a block diagram of an embodiment 1900 of optical integrator 506 according to the present invention. Embodiment 1900 incorporates embodiment 1700. However, in embodiment 1900, volume 604 comprises a first object 1902 and a second object 1904. First object 1902 is made of a first material. Second object 1904 is made of a second material. The first material and the second material are transparent to the wavelength of light produced by illumination source 502 (not shown). The second material can be, but is not necessarily, the same as the first material. First and second objects 1902 and 1904 define a first section 1906 of first surface 602. First section 1906 of first surface 602 can be substantially all of first surface 602. Second object 1904 defines second surface 1702.

Figure 20:
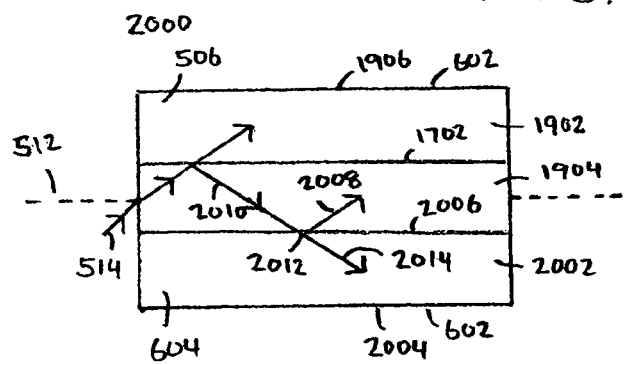

FIG. 20 is a block diagram of an embodiment 2000 of optical integrator 506 according to the present invention. Embodiment 2000 incorporates embodiment 1900. However, in embodiment 2000, volume 604 further comprises a third object 2002. Third object 2002 is made of a third material. Third object 2002 defines a second section 2004 of first surface 602. Third object 2002 defines a third surface 2006. Third surface 2006 has a first section 2012 of third surface 2006 that is semi-reflective. First section 2012 of third surface 2006 is configured to reflect a first portion 2008 of the light along a path 2010 incident upon first section 2012 of third surface 2006 and to transmit a second portion 2014 of the light along path 2010 incident upon first section 2012 of third surface 2006. The third material is transparent to the wavelength of light produced by illumination source 502 (not shown). The third material can be, but is not necessarily, the same as the first material, the second material, or both.

Figure 21:
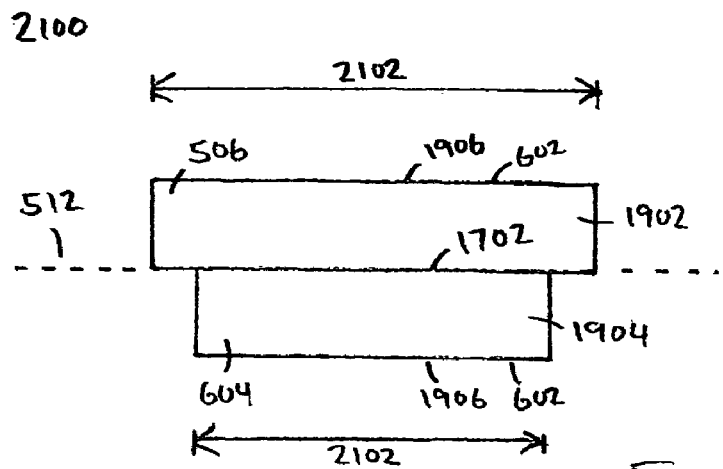

FIG. 21 is a block diagram of an embodiment 2100 of optical integrator 506 according to the present invention. Embodiment 2100 incorporates embodiment 1900. However, in embodiment 2100, a dimension 2102 of second object 1904 is different from dimension 2102 of first object 1902.

Figure 22:
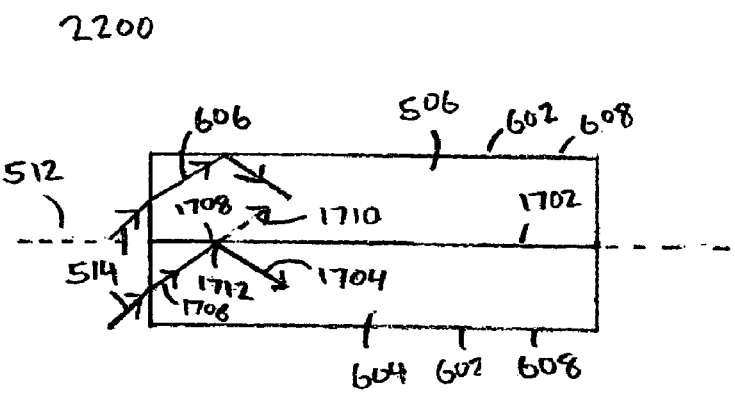

FIG. 22 is a block diagram of an embodiment 2200 of optical integrator 506 according to the present invention. Embodiment 2200 comprises first surface 602 and second surface 1702. First surface 602 is reflective, defines volume 604, and is configured to be disposed in, for example, optical illumination system 500 (not shown) along optical axis 512, to surround optical axis 512, and to reflect the light along path 606 incident upon first surface 602. First surface 602 can have film 608 of the material that causes substantially optimal reflection of the light along path 606 at first surface 602 with substantially minimal transmission of the light along path 606 through first surface 602.

Second surface 1702 is disposed in volume 604 and has first section 1708 of second surface 1702 that is at least semi-reflective. First section 1708 of second surface 1702 is configured to reflect first portion 1704 of the light along path 1706 incident upon first section 1708 of second surface 1702. Second surface 1702 can be configured to increase at least one of a uniformity of an intensity distribution of beam 514 and a telecentricity of beam 514. The location of second surface 1702 in volume 604 can be determined from a measure of the intensity distribution of the light across the plane orthogonal to optical axis 512 in beam 514 (not shown) produced by illumination source 502 (not shown), the degree of the telecentricity of beam 514 (not shown) produced by illumination source 502 (not shown), or both. Volume 604 is configured to comprise a gas or a vacuum.

First portion 1704 of the light along path 1706 incident upon first section 1708 of second surface 1702 can be substantially all of the light along path 1706 incident upon first section 1708 of second surface 1702. Alternatively, first section 1708 of second surface 1702 can be configured to transmit second portion 1710 of the light along path 1706 incident upon first section 1708 of second surface 1702.

Figure 23:
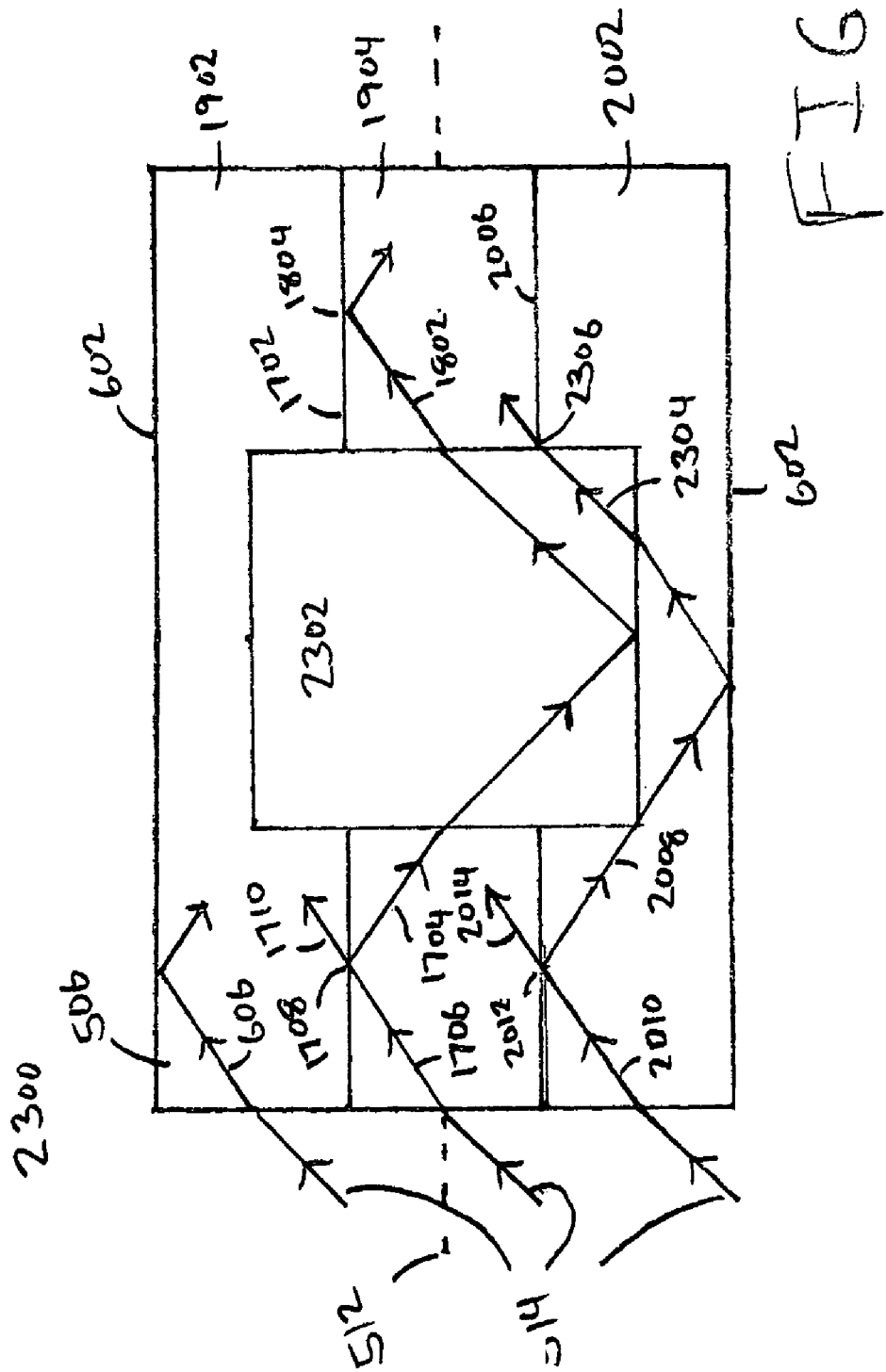

The skilled artisan recognizes that embodiments 1700 through 2200 can incorporate one or more of the features from each other. For example, FIG. 23 is a block diagram of an embodiment 2300 of optical integrator 506 according to the present invention that incorporates some of the features from embodiments 1700 through 2200 as presented above. Embodiment 2300 comprises first object 1902, second object 1904, third object 2002, and a volume 2302. First object 1902 is made of the first material. Second object 1904 is made of the second material. Third object 2002 is made of the third material. Volume 2302 is configured to comprise a gas or a vacuum. First object 1902, second object 1904, third object 2002, and volume 2302 are configured to be disposed in, for example, optical illumination system 500 (not shown) along optical axis 512. First object 1902, second object 1904, and third object 2002 define first surface 602. Volume 2302 is disposed in first object 1902, second object 1904, and third object 2002.

First surface 602 is reflective and is configured to surround optical axis 512 and to reflect the light along path 606 incident upon first surface 602. Second object 1904 defines second surface 1702. Second surface 1702 has first section 1708 of second surface 1702 that is semi-reflective and second section 1804 of second surface 1702 that is reflective. First section 1708 of second surface 1702 is configured to reflect first portion 1704 of the light along path 1706 incident upon first section 1708 of second surface 1702 and to transmit second portion 1710 of the light along path 1706 incident upon first section 1708 of second surface 1702. Second section 1804 of second surface 1702 is configured to reflect the light along path 1802 incident upon second section 1804 of second surface 1702. Third object 2002 defines third surface 2006. Third surface 2006 has first section 2012 of third surface 2006 that is semi-reflective and a second section 2306 of third surface 2006 that is transmissive. First section 2012 of third surface 2006 is configured to reflect first portion 2008 of the light along path 2010 incident upon first section 2012 of third surface 2006 and to transmit second portion 2014 of the light along path 2010 incident upon first section 2012 of third surface 2006. Second section 2306 of third surface 2006 is configured to transmit the light along a path 2304 incident upon second section 2306 of third surface 2006. The first material, the second material, and the third material are transparent to the wavelength of light produced by illumination source 502 (not shown).

In embodiments 1700 through 2300, first surface 602 can have any of a number of shapes, which can be determined from the measure of the intensity distribution of the light across the plane orthogonal to optical axis 512 in beam 514 produced by illumination source 502, the degree of the telecentricity of beam 514 produced by illumination source 502, or both. For example, first surface 602 can have any the shapes of embodiments 700 through 1300 as depicted at FIGS. 7 through 13. However, it should be understood that in the present invention first surface 602 is not limited to these shapes.

Figure 24:
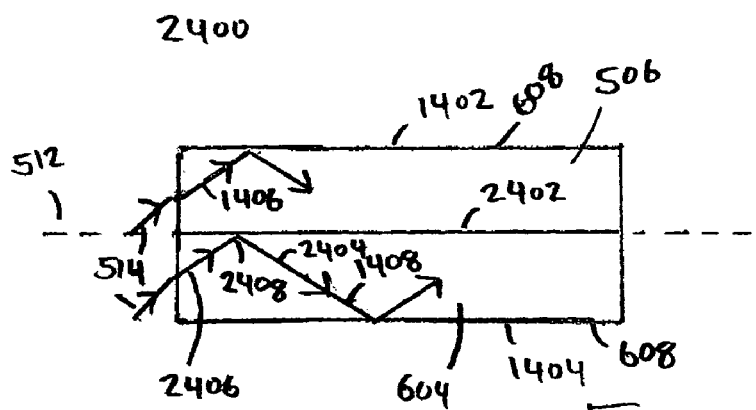

FIG. 24 is a block diagram of an embodiment 2400 of optical integrator 506 according to the present invention. Embodiment 2400 comprises first surface 1402, second surface 1404, and a third surface 2402. First and second surfaces 1402 and 1404 are reflective, define volume 604, and are configured to be disposed in, for example, optical illumination system 500 (not shown) along optical axis 512 with optical axis 512 between first and second surfaces 1402 and 1404. First surface 1402 is configured to reflect the light along a path 1406 incident upon first surface 1402. Second surface 1404 is configured to reflect the light along a path 1408 incident upon second surface 1404. Second surface 1404 is separate from first surface 1402.

Each of first and second surfaces 1402 and 1404 can have film 608 of the material that causes substantially optimal reflection of lights 1406 and 1408 at first and second surfaces 1402 and 1404 with substantially minimal transmission of lights 1406 and 1408 through first and second surfaces 1402 and 1404. Volume 604 can be an object (not shown) made of the material that is transparent to the wavelength of light produced by illumination source 502 (not shown). Alternatively, volume 604 can be configured to comprise a gas or a vacuum.

Third surface 2402 is disposed in volume 604 and has a first section 2408 of third surface 2402 that is at least semi-reflective. First section 2408 of third surface 2402 is configured to reflect a first portion 2404 of the light along a path 2406 incident upon first section 2408 of third surface 2402. Third surface 2402 can be configured to increase at least one of a uniformity of an intensity distribution of beam 514 and a telecentricity of beam 514. The location of third surface 2402 in volume 604 can be determined from a measure of the intensity distribution of the light across the plane orthogonal to optical axis 512 in beam 514 (not shown) produced by illumination source 502 (not shown), the degree of the telecentricity of beam 514 (not shown) produced by illumination source 502 (not shown), or both.

In embodiment 2400, the orientation of second surface 1404 with respect to first surface 1402 can be any of a variety of orientations, which can be determined from the measure of the intensity distribution of the light across the plane orthogonal to optical axis 512 in beam 514 produced by illumination source 502, the degree of the telecentricity of beam 514 produced by illumination source 502, or both. For example, the orientation of second surface 1404 with respect to first surface 1402 can be any of the orientations of embodiments 1500 and 1600 as depicted at FIGS. 15 and 16. However, it should be understood that in the present invention the orientation of second surface 1404 with respect to first surface 1402 in the present invention is not limited to these orientations. Furthermore, the skilled artisan recognizes that embodiments 2400 can incorporate one or more of the features from embodiments 1700 through 2300.

FIG. 25 is a flow chart of a method 2500 for increasing at least one of a uniformity of an intensity distribution of a beam of light and a telecentricity of the beam according to the present invention. In method 2500, at a step 2502, a light along a path incident upon a first surface is reflected from the first surface. The first surface defines a volume. At a step 2504, a first portion of a light along a path incident upon a first section of a second surface is reflected from the first section of the second surface. The second surface is disposed in the volume. At a step 2506, a second portion of the light along the path incident upon the first section of the second surface is transmitted from the first section of the second surface.

FIG. 26 is a flow chart of a method 2600 for increasing at least one of a uniformity of an intensity distribution of a beam of light and a telecentricity of the beam according to the present invention. In method 2600, at step at a step 2602, a light along a path incident upon a first surface is reflected from the first surface. The first surface defines a volume. The volume is configured to comprise a gas or a vacuum. At a step 2604, a first portion of a light along a path incident upon a first section of a second surface is reflected from the first section of the second surface. The second surface is disposed in the volume.

FIG. 27 is a flow chart of a method 2700 for increasing at least one of a uniformity of an intensity distribution of a beam of light and a telecentricity of the beam according to the present invention. In method 2700, at step at a step 2702, a light along a path incident upon a first surface is reflected from the first surface. At step at a step 2704, a light along a path incident upon a second surface is reflected from the second surface. The first and the second surfaces define a volume. The second surface is separate from the first surface. At a step 2706, a first portion of a light along a path incident upon a first section of a third surface is reflected from the first section of the third surface. The third surface is disposed in the volume.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description of the Invention section, and not the Brief Summary of the Invention and Abstract of the Disclosure sections, is intended to be used to interpret the claims. The Summary and Abstract sections can set forth one or more, but not all exemplary embodiments of the present invention as contemplated by the inventors, and thus, are not intended to limit the present invention and the appended claims in any way.

What is claimed is:

1. An optical integrator, comprising:
   a first surface that is reflective and that defines a side of a volume, wherein the first surface and is configured to:
   be disposed in an optical illumination system along an optical axis, and
   surround the optical axis; and
   a second surface disposed in the volume and having a section that is configured to reflect a first portion of a beam and to transmit a second portion of the beam, wherein the first surface is configured to reflect the first and second portions of the beam.

2. The optical integrator of claim 1, wherein the second surface is configured to increase at least one of a uniformity of an intensity distribution of the beam and a telecentricity of the beam.

3. The optical integrator of claim 1, wherein the optical illumination system is disposed in a lithographic apparatus.

4. The optical integrator of claim 1, wherein the section of the second surface is substantially all of the second surface.

5. The optical integrator of claim 4, wherein the second surface has a film of a material that causes reflection of the first portion of the beam along a path incident upon the second surface and transmission of the second portion of the beam along a path incident upon the second surface.

6. The optical integrator of claim 1, wherein the section is a first section and wherein the second surface has a second section that is reflective and is configured to reflect the beam along a path incident upon the second section of the second surface.

7. The optical integrator of claim 6, wherein:
   the first section of the second surface has a film of a first material that causes reflection of the first portion of the beam along a path incident upon the first section of the second surface and transmission of the second portion of the beam along a path incident upon the first section of the second surface; and
   the second section of the second surface has a film of a second material that causes reflection of the beam along the path incident upon the second section of the second surface.

8. The optical integrator of claim 1, wherein the section is a first section and wherein the second surface has a second section that is transmissive and is configured to transmit the beam along a path incident upon the second section of the second surface.

9. The optical integrator of claim 8, wherein:
   the first section of the second surface has a film of a first material that causes reflection of the first portion of the beam along a path incident upon the first section of the second surface and transmission of the second portion of the beam along a path incident upon the first section of the second surface; and
   the second section of the second surface has a film of a second material that causes transmission of the beam along the path incident upon the second section of the second surface.

10. An optical integrator, comprising:
    a first surface that is reflective, defines a volume and is configured to be disposed in an optical illumination system along an optical axis, to surround the optical axis, and to reflect a light along a path incident upon the first surface; and a second surface disposed in the volume and having only a first section of the second surface that is semi-reflective and is configured as a beam splitter, the volume comprises a first object, a second object and a third object, wherein, the first, second, and third objects comprise respective first, second, and third materials that are transparent to a predetermined wavelength of radiation;

the first object and the second object define a first section of the first surface, the second object defines the second surface, and the third object defines a second section of the first surface and a third surface, the third surface being configured as a beam splitter.

11. The optical integrator of claim 10, wherein the first section of the first surface is substantially all of the first surface.

12. The optical integrator of claim 10, wherein a dimension of the second object is different from the dimension of the first object.

13. The optical integrator of claim 1, wherein a shape of the first surface comprises a prism, a cylinder, or a frustum.

14. The optical integrator of claim 13, wherein the prism is a rectangular prism, the cylinder is an elliptic cylinder, or the frustum is a pyramidic frustum or a conic frustum.

15. The optical integrator of claim 1, wherein the volume is filled by a gas or a vacuum.

16. The optical integrator of claim 15, wherein the first portion of the beam along the path incident upon the first section of the second surface is substantially all of the beam along the path incident upon the first section of the second surface.

17. The optical integrator of claim 15, wherein the first section of the second surface is configured to transmit a second portion of the beam along the path incident upon the first section of the second surface.

18. An optical integrator, comprising:
a first and second reflective surfaces that together define a side of a volume and are configured to:
be disposed in an optical illumination system along an optical axis with the optical axis between the first surface and the second surface,
to reflect a beam along a path incident upon the first surface, and
to reflect the beam along a path incident upon the second surface; and a third surface disposed in the volume and having a first section that is at least semi-reflective and is configured to reflect a first portion of the beam and transmit a second portion of the beam;

wherein the second surface is separate from the first surface and wherein each of the first and second surfaces are configured to reflect each of the first and second portions of the beam.

19. The optical integrator of claim 18, wherein the second surface is substantially parallel to the first surface.

20. The optical integrator of claim 18, wherein the second surface one of converges and diverges with the first surface in a direction along the optical axis.

21. A method for increasing at least one of a uniformity of an intensity distribution of a beam of light and a telecentricity of the beam, comprising:
reflecting the beam off of a first surface of an optical integrator along a path incident upon the first surface;
reflecting a first portion of the beam off of a first section of a second surface of the optical integrator along a path incident upon a first section of a second surface;
transmitting a second portion of the beam along the path incident upon the first section from the first section; and
reflecting the first and second portions of the beam off of the first surface;
wherein the first surface defines a side of a volume and the second surface is disposed in the volume.

22. The method of claim 21, wherein the volume is filled by a gas or a vacuum.

23. A method for increasing at least one of a uniformity of an intensity distribution of a beam of light and a telecentricity of the beam, comprising:
reflecting the beam off of a first surface of an optical integrator along a path incident upon the first surface;
reflecting the beam off of a second surface of the optical integrator along a path incident upon the second surface;
reflecting a first portion of the beam the beam off a first section of a third surface along a path incident upon a first section of a third surface; and
reflecting each of the first and second portions of the beam off of each of the first surface and second surfaces;
wherein the first surface and the second surface define a side of a volume,
wherein the second surface is separate from the first surface, and
wherein the third surface is disposed in the singular object.

24. The optical integrator of claim 10, wherein the second material is the same as the first material.

* * * * *